(12) United States Patent
Anglhuber et al.

(10) Patent No.: US 12,327,676 B2
(45) Date of Patent: Jun. 10, 2025

(54) HIGH VOLTAGE TRANSFORMER, METHOD FOR PRODUCING A HIGH VOLTAGE TRANSFORMER AND TEST SYSTEM AND TEST SIGNAL DEVICE COMPRISING A HIGH VOLTAGE TRANSFORMER

(71) Applicant: Omicron electronics GmbH, Klaus (AT)

(72) Inventors: Martin Anglhuber, Feldkirch (AT); Reinhard Kaufmann, Thüringerberg (AT); Lukas Bitschnau, Braz (AT)

(73) Assignee: Omicron electronics GmbH, Klaus (AT)

( * ) Notice: Subject to any disclaimer, the term of this patent is extended or adjusted under 35 U.S.C. 154(b) by 656 days.

(21) Appl. No.: 17/610,308

(22) PCT Filed: May 13, 2020

(86) PCT No.: PCT/EP2020/063299
§ 371 (c)(1),
(2) Date: Nov. 10, 2021

(87) PCT Pub. No.: WO2020/229523
PCT Pub. Date: Nov. 19, 2020

(65) Prior Publication Data
US 2022/0246352 A1    Aug. 4, 2022

(30) Foreign Application Priority Data
May 13, 2019  (AT) .............. A 50429/2019

(51) Int. Cl.
*H01F 27/28*    (2006.01)
*G01R 31/62*    (2020.01)
(Continued)

(52) U.S. Cl.
CPC ............ *H01F 30/16* (2013.01); *G01R 31/62* (2020.01); *H01F 27/2823* (2013.01);
(Continued)

(58) Field of Classification Search
CPC .. H01F 30/16; H01F 27/2823; H01F 27/2895; H01F 27/324; H01F 41/08;
(Continued)

(56) References Cited

U.S. PATENT DOCUMENTS 5,838,220 A    11/1998 Hagberg
7,271,691 B2    9/2007 Gu et al.
(Continued)

FOREIGN PATENT DOCUMENTS

AT        231555 B    2/1964
CH        353454 A    4/1961
(Continued)

OTHER PUBLICATIONS

International Search Report with English translation, counterpart International Appl. No. PCT/EP2020/063299 (Aug. 28, 2020) (9 pages).
(Continued)

*Primary Examiner* — Shawki S Ismail
*Assistant Examiner* — Kazi S Hossain
(74) *Attorney, Agent, or Firm* — Cook Alex Ltd.

(57) ABSTRACT

The invention relates to a high-voltage transformer which is configured as a toroidal transformer. The high-voltage transformer has a magnetizable core (310) and a high-voltage winding (330) and a low-voltage winding (320) around the magnetizable core (310). The high-voltage winding (330) is embodied at least partially as a pilgrim step winding.

11 Claims, 5 Drawing Sheets

(51) Int. Cl.
*H01F 27/32* (2006.01)
*H01F 30/16* (2006.01)
*H01F 41/08* (2006.01)

(52) U.S. Cl.
CPC ....... *H01F 27/2895* (2013.01); *H01F 27/324* (2013.01); *H01F 41/08* (2013.01)

(58) Field of Classification Search
CPC ........... H01F 2027/2842; H01F 27/306; H01F 41/00; G01R 31/62; G01R 31/72; G01R 31/14; G01R 31/1254; G01R 1/28; G01R 31/00
USPC .............................. 336/229, 221, 83, 60–65
See application file for complete search history.

(56) References Cited

U.S. PATENT DOCUMENTS

| | | | |
|---|---|---|---|
| 2002/0140538 A1* | 10/2002 | Yer | H05B 41/2822 336/198 |
| 2008/0308662 A1* | 12/2008 | Yang | H01F 27/2823 242/160.1 |
| 2014/0232508 A1 | 8/2014 | Inaba | |
| 2014/0340057 A1 | 11/2014 | Campeanu et al. | |
| 2015/0228393 A1 | 8/2015 | Waffler | |
| 2016/0099103 A1 | 4/2016 | Mashikian et al. | |
| 2017/0163145 A1* | 6/2017 | Cheng | H02M 1/12 |
| 2017/0323718 A1 | 11/2017 | Foley | |
| 2018/0211761 A1 | 7/2018 | Zhang et al. | |
| 2018/0268982 A1* | 9/2018 | Sturcken | H01L 28/10 |

FOREIGN PATENT DOCUMENTS

| | | |
|---|---|---|
| CN | 2430767 Y | 5/2001 |
| CN | 103636110 | 3/2014 |
| CN | 103858186 A | 6/2014 |
| CN | 203631290 U | 6/2014 |
| CN | 104170035 | 11/2014 |
| CN | 105489360 A | 4/2016 |
| CN | 105513757 A | 4/2016 |
| CN | 205595200 | 9/2016 |
| CN | 206460860 | 9/2017 |
| CN | 109416979 | 3/2019 |
| DE | 1538129 | 7/1969 |
| DE | 102014202531 | 8/2015 |
| EP | 2704167 | 3/2014 |
| EP | 3447507 A | 2/2019 |
| EP | 3447507 A1 * | 2/2019 |
| JP | 2013214628 | 10/2013 |
| RU | 164179 | 8/2016 |
| RU | 2662952 | 7/2018 |
| WO | WO 2014/116127 | 7/2014 |
| WO | WO2015/012727 | 1/2015 |
| WO | WO2018/083409 | 5/2018 |

OTHER PUBLICATIONS

International Written Opinion Report, counterpart International Appl. No. PCT/EP2020/063299 (Aug. 28, 2020) (10 pages).
Russian Search Report (with English translation), counterpart Russian App. No. 2021136438 (Jun. 30, 2022) (4 pages).
Office Action and Search Report (with English-language translation), counterpart Chinese App. No. 202080035797.2 (Feb. 20, 2024) (17 pages).

* cited by examiner

HIGH VOLTAGE TRANSFORMER, METHOD FOR PRODUCING A HIGH VOLTAGE TRANSFORMER AND TEST SYSTEM AND TEST SIGNAL DEVICE COMPRISING A HIGH VOLTAGE TRANSFORMER

The present application is a U.S. National Stage of PCT International Patent Application No. PCT/EP2020/063299, filed May 13, 2020, which claims priority to Austrian Application No. A50429/2019, filed May 13, 2019, both of which are hereby incorporated herein by reference.

FIELD OF THE INVENTION

The invention is in the field of high-voltage measurement technology and relates in particular to high-voltage transformers, metdirectionhods for producing same, high-voltage test signal apparatuses and test systems for testing a high-voltage device by means of a test signal with a high voltage.

BACKGROUND

High-voltage devices such as power transformers or switchgear assemblies—in particular gas-insulated switchgear assemblies—are usually used in electrical energy supply networks to convert and distribute electrical energy. Other high-voltage devices such as high-voltage potential transformers or high-current transformers, for example for measuring voltages and currents occurring in a power grid, power switches and power generators are also commonly used in this context. High-voltage devices of this kind, or other high-voltage devices such as electric (power) motors, are also employed in industrial settings, in particular for production.

It may be necessary to check the functions and properties of installations comprising high-voltage devices of this kind in order to commission or service said installations. In this context, for example, an insulation material of a high-voltage device—such as a high-voltage current transformer, a high-voltage potential transformer or a power switch—can be checked, for example by measuring the DC voltage resistance. In this context, for example, a loss factor or a capacitance of a high-voltage device—such as a power transformer or a rotary machine of a generator or an electric motor, for example—can also be measured, which may also provide information about a (remaining) quality of insulating materials or insulating liquids. A partial discharge measurement can also be carried out. In order, in particular, to enable measurement that reflects the conditions in real operation, high voltages can also be used as a test signal during the measurement.

In addition to or as an alternative to measurements in the laboratory, measurements in the field—i.e. for example outdoors or in an industrial environment—are often carried out for the purpose of the check.

For field use, test devices that incorporate a signal generator and a high-voltage transformer or that use a variable transformer to convert a network voltage into a high voltage in order to generate a test signal with a high voltage—that is to say in particular a test signal with a high voltage amplitude or a high RMS voltage—are known. While the operational safety of a test device of this kind may require measures for insulating the high-voltage winding of the high-voltage transformer or variable transformer—i.e. the winding which is electrically on the test signal side—from the other parts of the test device that are not on the high-voltage side, in particular the low-voltage winding, the test device should, in particular for field use, be lightweight and robust for transportation to the respective location of use.

SUMMARY OF THE INVENTION

There is therefore a need for a powerful high-voltage transformer which has a relatively low weight and a relatively simple structure, so that the high-voltage transformer is both inexpensive to produce and also suitable for use in a portable test device. In addition, the invention is based on the object of providing a corresponding test system and a corresponding production method.

According to the invention, a high-voltage transformer having the features of claim 1 or 11, a test signal apparatus having the features of claim 8, a test system having the features of claim 9 are provided. The dependent claims define preferred and/or advantageous embodiments of the invention.

A first aspect of the invention relates to a high-voltage transformer which is preferably configured for a test system for testing a high-voltage device. The high-voltage transformer is configured as a toroidal transformer and has a magnetizable core, a high-voltage winding and a low-voltage winding. The high-voltage winding and the low-voltage winding are arranged around the magnetizable core in a manner electrically insulated from one another, wherein the high-voltage winding is embodied at least partially as a pilgrim step winding.

In the context of the invention, a "low-voltage winding" and a "high-voltage winding" are intended to be understood to mean windings that have one or more turns of an electrical conductor around a (local) circumference of a transformer core of the high-voltage transformer, wherein the electrical conductor is mostly enveloped in an insulating layer to prevent short circuits between the individual turns. A winding of this kind mostly uses a coil wire or a coil stranded wire, which is wound along a circumferential direction around the transformer core, such that a current flowing through the electrical conductor induces a magnetic flux in the transformer core, and the proportions of the magnetic flux for each turn at least substantially add up. A winding of this kind usually extends along a (local) forward direction of the transformer core. A plurality of the turns of a winding of this kind may in this case be lined up along the forward direction or counter to it.

The voltage present at the low-voltage winding is converted, depending on the turns ratio, into a high voltage that can be tapped from the high-voltage winding.

In the context of the present invention, a "high voltage" is considered to be a voltage in the region of 1 kV and above, such that the high-voltage transformer according to the invention is configured to generate and provide correspondingly high output voltages.

According to one embodiment, the high voltage provided by the high-voltage transformer may, in particular, be such that it can serve as a test voltage for testing a high-voltage device.

In the context of the invention, a "high-voltage device" is intended to be understood to mean at least one device—for example as part of a high-voltage installation for supplying energy or as part of an electrically operated production installation—which is operated with a high voltage or a high electric current, controls, converts or measures same, or can be exposed to a high voltage for some other reason and thus has to be set up for safe operation—for example by means of sufficient electrical insulation. In particular, a high-voltage device of this kind may be a power transformer, a (high-voltage) switchgear assembly, a (high-voltage) circuit breaker or power switch, a rotary machine which is operated with a high voltage or generates a high voltage, such as a power electric motor or a power generator, a tap changer for a transformer, or an instrument transformer such as a high-voltage transformer or a high-current transformer.

In the context of the invention, a "pilgrim step winding"—also known as a "pilgrim winding" or a "pitched layer winding"—is intended to be understood to mean at least one winding for a transformer, which winding has a plurality of layers of turns around the transformer core, wherein the individual layers extend only along a section along or counter to the forward direction of the core, and a respective (electrically) subsequent layer extends in the respective opposite direction—i.e. counter to or along the forward direction—and partially overlaps the preceding layer in each case. Moreover, the layers which extend in the forward direction extend further (at least in total) than the other layers counter to the forward direction—or vice versa, accordingly—such that the pilgrim step winding extends over a larger section (compared to the sections of the individual layers) along—or, accordingly, counter to—the forward direction of the core.

In some embodiments, the entirety of the high-voltage winding can also be embodied as a or exactly one pilgrim step winding. In some embodiments, the high-voltage winding can also be embodied as a plurality of pilgrim step windings, wherein some or all of the pilgrim step windings adjoin one another or are adjacent to one another along the forward direction.

One advantage of the pilgrim step winding can in particular be that it makes it possible to transfer higher frequencies, as a result of which in particular power quality measurement applications can be made possible using the high-voltage transformer—i.e. in particular, when testing the high-voltage device, a load—and frequency-dependent response characteristic of the high-voltage device can be determined over a larger frequency range.

Another advantage of the pilgrim step winding can in particular be that a multilayer winding and therefore in particular a greater number of turns and/or a higher transformation ratio is made possible. Moreover, adjoining or adjacent turns or layers of the turns that correspondingly lie one above the other have a lower voltage difference—i.e. in particular a lower voltage between (double) layers—than in a multilayer helical or wild winding, for example, which would extend at least substantially over the entire core in each layer. This makes it possible to increase the operational safety and/or robustness and/or reduce the means required for electrically insulating the individual layers or adjacent turns from one another—for example an insulating enamel around a wire for the turns or insulating layers between the individual layers—, which can, for example, reduce the weight or further improve heat dissipation from the high-voltage winding to the magnetizable core but also to the outside, i.e. in particular in the direction of the low-voltage winding and the surroundings of the high-voltage transformer.

In the context of the invention, a "toroidal transformer" has at least one annular core comprising a magnetizable material—that is to say in particular what is known as a toroidal core—as the transformer core. A toroidal core of this kind is substantially annularly closed or almost closed. The toroidal core can preferably have a toroidal shape, for example in the form of a toroid or a tube section, or, more generally, a rounded three-dimensional body which has a central hole. In some variants, the toroidal core can be cut through from the central hole toward the outside in one section, i.e. it can have what is known as an air gap. In other variants, the toroidal core can be closed around the central hole, in particular along its toroidal direction, as a result of which, in particular, the magnetic flux can propagate in the magnetizable material along the toroidal direction without interruption.

In this advantageous way, the high-voltage winding and/or the low-voltage winding can be wound onto the magnetizable core, i.e. the toroidal core, over a large (longitudinal) section in the forward direction. Another advantage of a high-voltage transformer with a toroidal core as a magnetizable core/transformer core can be, in particular, that, during operation, the magnetic field lines largely run within the toroidal core, as a result of which magnetic interference fields can be reduced.

Another advantage of the toroidal transformer can in particular be that it has a form factor that can easily be integrated into a housing.

According to some embodiments, the high-voltage transformer has a protective layer, which is arranged between the high-voltage winding and the low-voltage winding. In this case, the protective layer has an electrically conductive layer for shielding the high-voltage winding from the low-voltage winding. In this advantageous way, crosstalk between the high-voltage winding and the low-voltage winding can be reduced, as a result of which, particularly when the conductive layer is connected to a suitable potential, for example an earthing connection, shielding from interference that could propagate from the high-voltage side to the low-voltage side or in the opposite direction can be achieved.

According to some embodiments, the magnetizable core has an insulation layer made of an electrically insulating material for electrically insulating the magnetizable core from the low-voltage winding and from the high-voltage winding.

According to one embodiment, the high-voltage winding is arranged close to the core or directly on the magnetizable core. In this embodiment, at most insulation is provided between the core and the high-voltage winding. The low-voltage winding is preferably arranged around the high-voltage winding.

An advantage of arranging the high-voltage winding around the magnetizable core and the low-voltage winding around the high-voltage winding can in particular be that a circumference of the turns of the high-voltage winding is reduced and a shorter wire length is required for the high-voltage winding, as a result of which, in particular, losses can be reduced and/or the frequency response can be further improved, particularly for higher frequencies.

Another advantage of arranging the high-voltage winding around the magnetizable core and the low-voltage winding around the high-voltage winding can in particular be that the high-voltage winding is arranged closer to the core, as a result of which any heat that could occur during operation due to losses in the high-voltage winding—for example ohmic losses—can be dissipated toward the magnetizable core, and the high-voltage winding can therefore (at least temporarily) be cooled by heat dissipation toward the magnetizable core, or a temperature of the high-voltage winding can be buffered by the magnetizable core. The improved heat dissipation makes it possible to enhance the performance of the high-voltage transformer and/or reduce the weight thereof, wherein, in particular, a transformation ratio of the high-voltage transformer can be increased and an achievable output voltage and/or a (temporarily) possible maximum electric output power at the high-voltage winding can be increased.

According to a preferred embodiment of the invention, the magnetizable core is "floating" and has no electrical contact or no electrical connection to earth or ground. The magnetizable core is electrically insulated from earth and also from the high-voltage winding and low-voltage winding. The geometry of the high-voltage transformer may in this case be selected such that the maximum voltage that can occur between the high-voltage winding and the magnetizable core is only half the voltage that would occur if the magnetizable core were at earth potential.

Further aspects of the invention relate to a method for producing a high-voltage transformer of this kind, a test signal apparatus for a test system for testing a high-voltage device, which comprises a high-voltage transformer according to the embodiments described above, and a correspondingly configured test system for testing a high-voltage device.

Further advantages, features and possible applications will emerge from the following detailed description of exemplary embodiments and/or from the figures.

BRIEF DESCRIPTION OF THE FIGURES

The invention will be explained in more detail below with reference to the figures, on the basis of advantageous exemplary embodiments. The same elements or components of the exemplary embodiments are essentially denoted by the same reference signs, unless this is described otherwise or is revealed to be otherwise by the context.

To this end, in some cases schematically.

The figures are schematic representations of various embodiments and/or exemplary embodiments of the present invention. Elements and/or components shown in the figures are not necessarily shown true to scale. Rather, the various elements and/or components shown in the figures are rendered in such a way that the function and/or purpose thereof can be understood by a person skilled in the art.

Connections and couplings shown in the figures between functional units and elements can also be implemented as indirect connections or couplings. In particular, data connections can be in the form of wired or wireless connections, i.e. in particular in the form of a radio connection. Certain connections, for example electrical connections, for example for supplying energy, may also not be shown for the sake of clarity.

DETAILED DESCRIPTION OF EXEMPLARY EMBODIMENTS

Figure 1:
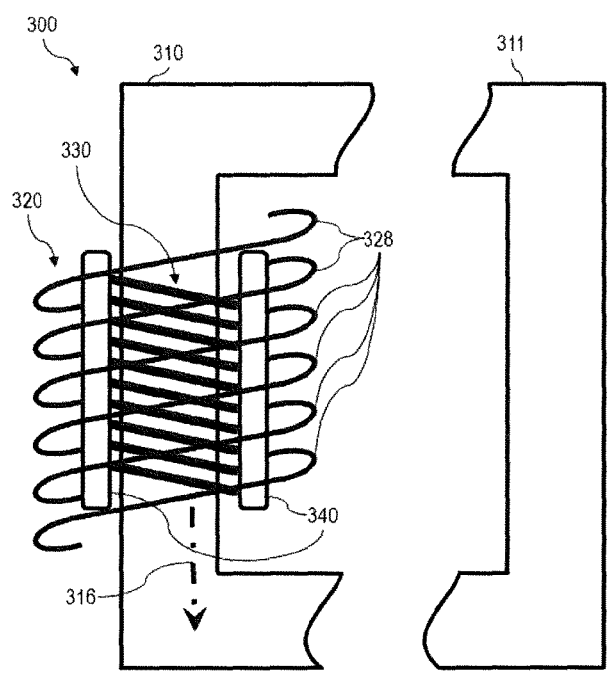
FIG. 1 shows a high-voltage transformer according to one embodiment.

FIG. 1 schematically shows a high-voltage transformer 300 according to one embodiment of the present invention.

The high-voltage transformer 300 has a magnetizable core 310, 311, a low-voltage winding 320, a high-voltage winding 330 and a protective layer 340. The low-voltage winding 320 and the high-voltage winding 330 extend along a forward direction 316 of the magnetizable core. The high-voltage winding is arranged at least around a part, in particular a length section, of the magnetizable core 310, 311 and is configured as a pilgrim step winding. In the exemplary embodiment shown, the high-voltage winding 330 is located directly on the magnetizable core 310, 311. The protective layer 340 is arranged around the high-voltage winding 330 and has an insulating material and thus electrically insulates the low-voltage winding 320, which is arranged further outside relative to the high-voltage winding and the protective layer 340, from the high-voltage winding 330.

The low-voltage winding 320 has a plurality of turns 328. In some advantageous variants, the turns 328 can be wound helically around the magnetizable core 310 toward the forward direction 316 and, accordingly, in parts comprising the high-voltage winding 330 or the protective layer 340, can also be wound around these. For this purpose, in some variants, an enamel-insulated coil wire, in particular made of copper, can be helically wound around the magnetizable core 310.

In the embodiment shown, for the sake of simplicity, the windings are shown only for a section 310 of the magnetizable core. The high-voltage transformer 300 is configured as a toroidal transformer, such that the high-voltage winding 330 and the low-voltage winding 320 actually extend in an annular fashion along the entire length of the annular magnetizable core 310, 311. Alternatively, it is also possible for a plurality of electrically interconnected high-voltage windings 330 and/or a plurality of electrically interconnected low-voltage windings 320 or a plurality of sections of the high-voltage winding 330 and/or a plurality of sections of the low-voltage winding 320 to be arranged in a manner spaced apart from one another or else laid one on top of the other along different length sections 310, 311 of the magnetizable core, such that a toroidal transformer is formed overall.

The core 310, 311 is annularly closed or almost closed, wherein in the latter case the annular core 310, 311 is interrupted only by an air gap. The annular shape can be toroidal; however, as shown in the figures, angular configurations are also possible.

Figure 2:
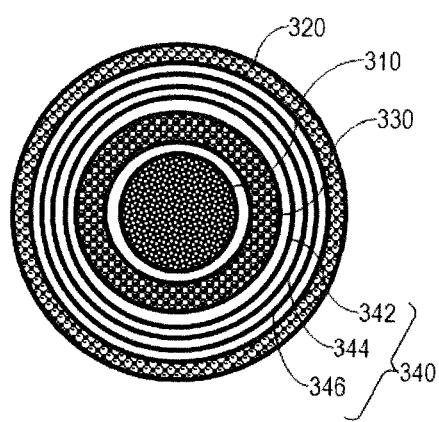
FIG. 2 shows a cross section through the high-voltage transformer of FIG. 1.

FIG. 2 shows a cross-section through the high-voltage transformer 300 to illustrate the structure thereof from the inside, i.e. from the magnetizable core, to the outside, i.e. toward the low-voltage winding, wherein the cross-section is at least substantially perpendicular to the forward direction of the magnetizable core.

The high-voltage winding 330 is arranged concentrically around the magnetizable core 310. The protective layer 340 is then arranged concentrically around the high-voltage winding 330. Finally, the low-voltage winding 320 is arranged concentrically around the protective layer 340. The high-voltage winding 330 is thus arranged further inside and the low-voltage winding 320 further outside, relative to one another or relative to the protective layer 340, such that the high-voltage winding 330 is closer to the magnetizable core 310. In some advantageous variants, the high-voltage winding 330 touches the magnetizable core or is separated therefrom only by an insulation layer (not shown in FIG. 2), which allows improved thermal coupling between the high-voltage winding 330 and the magnetizable core 310, as a result of which the performance can be enhanced.

In some advantageous variants, as shown, the protective layer 340 has a first electrically insulating layer 342, an electrically conductive layer 344 and a second electrically insulating layer 346. In this advantageous way, the high-voltage winding and the low-voltage winding can be shielded from one another by means of the electrically conductive layer 344, and the electrically conductive layer 344 can be electrically insulated both from the high-voltage winding by means of the first electrically insulating layer 342 and from the low-voltage winding by means of the second electrically insulating layer 346. In some variants, the first electrically insulating layer 342 can be electroplated and the electrically conductive layer 344 can be applied thereto in this way. In other variants, the electrically conductive layer 344 can also be applied by vapor deposition (in particular as metal vapor) or adhesive bonding (in particular as metal foil). Furthermore, in some variants, the second electrically insulating layer 346 can be omitted.

Figure 3:
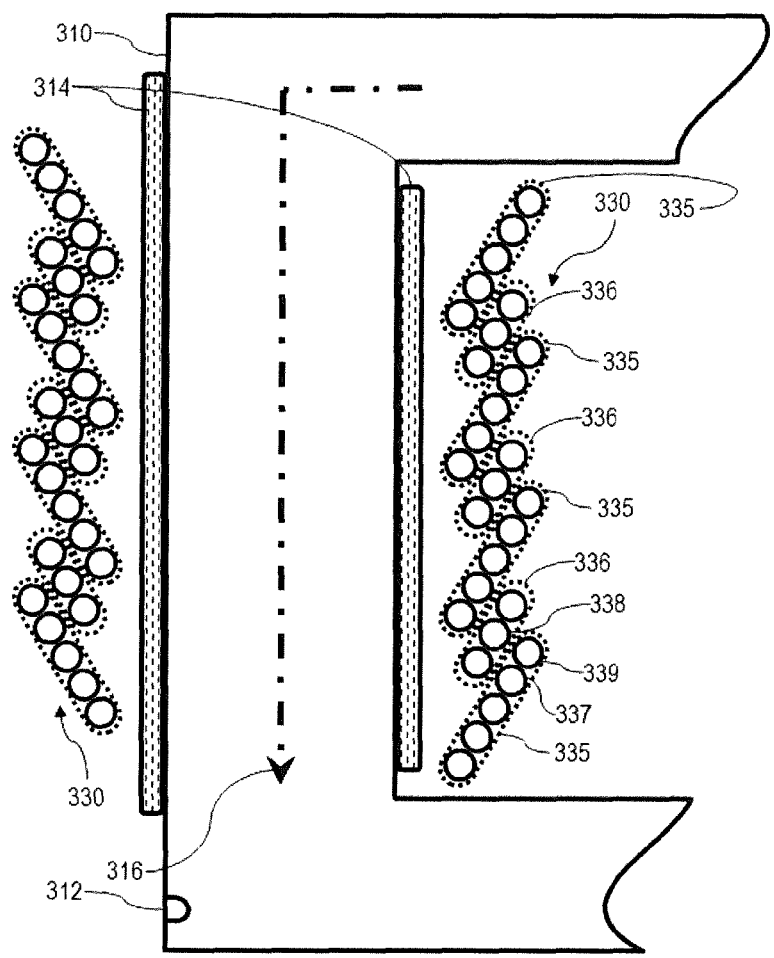
FIG. 3 shows a longitudinal section through a high-voltage transformer according to a further embodiment.

FIG. 3 shows a longitudinal section through a high-voltage transformer according to a further embodiment of the present invention to illustrate the high-voltage winding embodied as a pilgrim step winding, wherein any further components such as the protective layer, the low-voltage winding or a magnetic connecting element, for example, are not shown for the sake of clarity.

The high-voltage transformer shown in FIG. 3 may correspond to the high-voltage transformer 300 described with reference to FIG. 1 and/or FIG. 2, wherein the longitudinal section is at least substantially along the forward direction of the magnetizable core, such that the forward direction 316 lies at least substantially in the sectional plane.

The forward direction 316 is illustrated in FIG. 3 by a dashed, angled arrow, wherein the forward direction is intended to be understood relative to the respective position at the magnetizable core 310 and to a possible magnetic flux and consequently represents a local direction, which in particular in each case points locally in the direction of a possible magnetic flux (or always counter to this direction). Thus, if the forward direction is in each case followed locally in the case of a closed magnetizable core, a closed curve is obtained which encloses exactly one area.

The high-voltage winding 330 has a plurality of turns, which are grouped into a plurality of groups 335 of turns, which, in each group, are wound electrically in series and helically toward the forward direction around the magnetizable core 310, and into a plurality of groups 336 of turns, which, in each group, are wound electrically in series and helically counter to the forward direction around the magnetizable core. In this case, the groups 335 and 336 are alternately connected electrically in series with one another and alternately wound around the magnetizable core 310, such that a first number of turns in the forward direction for one of the groups 335 is followed by a second number of turns counter to the forward direction for one of the groups 336. In addition, the first number is greater than the second number, so that a winding in the forward direction is obtained overall.

To produce the high-voltage winding 330, a coil wire can alternately be wound around the core 310 in the forward direction for the first number of turns and be wound around the core 310 in the reverse direction—that is to say counter to the forward direction—for the second number of turns. In some advantageous variants, the coil wire can be an enamel-insulated copper wire.

By winding in the forward direction and counter to the forward direction, more turns can be wound around the magnetizable core 310 in a length section thereof than in the case of a helical winding only in the forward direction or only in the reverse direction. As a result, a large number of turns can be achieved overall without the need for a further layer of turns, which would extend over all the length sections of the magnetizable core intended for winding onto. Because winding is carried out in the forward and reverse directions for individual length sections of the magnetizable core in the pilgrim step winding, the length sections have a plurality of layers locally (so to speak), wherein the voltage difference between these "local layers" is less than in the case of a multilayer winding, in which turns are wound in each case over a total length of the magnetizable core that is to be wound onto. For example, as shown in FIG. 3, the turn 338 of one of the groups 336 is spatially adjacent to the turns 337 and 339 of one of the groups 335 and, moreover, only one or only two turns away from them electrically, as a result of which there is a relatively small voltage difference between the turns during operation of the high-voltage transformer.

In some variants, the magnetizable core 310 can also have an insulation layer 314. Said insulation layer can, as shown in FIG. 3, be connected to the core and envelop only a part, in particular a length section to be wound onto, of the core 310 or else surround the entire core 310 and thus electrically insulate it. In some variants, this can be particularly advantageous in combination with a magnetizable core 310 made of lamination steel, in particular a plurality of layers of lamination steel, which in particular can be wound to form a toroidal core.

Figure 4:
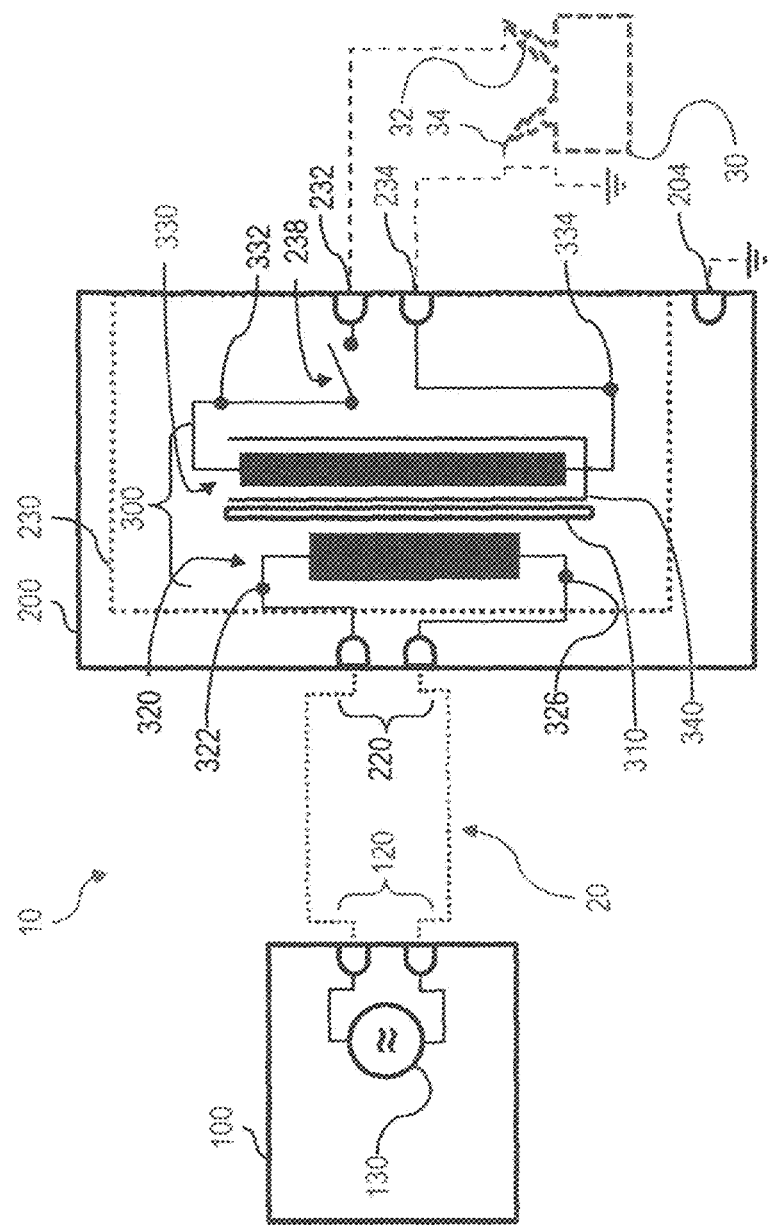
FIG. 4 shows a test system according to one embodiment.

FIG. 4 shows a test system 10 according to one embodiment of the present invention together with a high-voltage device 30 to be tested as a schematic block diagram, wherein, for more detailed illustration, some components of the test system and associated electrical connections, connection points and/or nodes are depicted schematically as a (basic) electrical circuit diagram.

In one exemplary embodiment, the test system 10 has a portable main device 100 and a portable high-voltage test signal apparatus 200. In this case, the high-voltage test signal apparatus 200, as a portable auxiliary device of the test system 10, enables additional (test) functions—in particular functions that are based on a high voltage—in addition to functions that the portable main device already provides.

The portable main device 100 has a housing and a power output 120 integrated into the housing. The portable high-voltage test signal apparatus 200 has a housing and a power input 220 integrated into the housing. The power output 120 and the power input 220 are electrically connected by means of a cable 20 during operation, i.e. for testing the high-voltage device 30.

The portable high-voltage test signal apparatus 200 furthermore has a test signal apparatus 230, the components of which are accommodated in the housing of the high-voltage test signal apparatus 200. In this case, a first test connection 232 and a second test connection 234 of the test signal apparatus 230 can be integrated, in a manner corresponding to the power input 220, in the housing of the portable high-voltage test signal apparatus 200.

During operation, that is to say when testing the high-voltage device 30, the first test connection 232 is electrically connected to a first connection point 32 of the high-voltage device 30 and, accordingly, the second test connection 234 is electrically connected to a second connection point 34 of the high-voltage device 30.

For earthing, the portable high-voltage test signal apparatus 200 can have an earthing connection 204, allowing, in particular, separate earthing—for example for increased operational reliability. Alternatively, one of the test connections can also serve at the same time as an earthing connection, allowing, in particular, simpler cabling.

The test signal apparatus 230 has the high-voltage transformer 300 according to one of the previously described embodiments, wherein, in FIG. 4, the high-voltage transformer 300 is shown only schematically with the magnetizable core 310, the low-voltage winding 320 and the high-voltage winding 330 and the protective layer 340. The magnetizable core 310 is designed as a toroidal core, providing, in particular, for low interference, a compact design and a form factor that can be easily integrated into a housing and thus a high-voltage test signal apparatus 200 that is particularly easy to transport. This compact design is synergistically supported by the high-voltage winding 330, which is preferably close to the core—and thus in particular thermally buffered by means of the magnetizable core 310. As already mentioned above, both the low-voltage winding 320 and the high-voltage winding 330 can be formed by a respective suitable number of partial windings.

As shown in FIG. 4, the high-voltage winding 330 has a first connection point 332 and a second connection point 334, wherein the second connection point 334 is electrically connected to the second test connection 234. The first connection point 332 can be electrically connected to the first test connection 232, wherein these can be connected to one another directly or, as shown, by means of an electrical switch 238 of the test signal apparatus 230. The switch 238 allows the first connection point 332 and the first test connection 232 to be selectively electrically connected, such that the electrical connection for applying a high voltage to the high-voltage device 30 can be established and disconnected, for example between individual test operations for safety.

The low-voltage winding 320 has a first connection point 322 and a second connection point 326. The first and second connection points 322, 326 are electrically connected to the power input 220 such that a power signal can be applied between the two connection points 322, 326 via the power input 220.

For generating the power signal, the portable main device 100 has a power signal source 130, in particular a controllable voltage source, which is electrically connected to the power output 120. In this case, the portable main device 100 is set up to control the power signal source 130 such that a voltage is applied between the first and second connection points 322, 326 of the low-voltage winding 320 by way of the power signal, and the high-voltage transformer 300 converts this voltage into a test signal for testing the high-voltage device 30, which is applied between the first and second connection points 332, 334 of the high-voltage winding 330—and thus also between the first and second test connections 232 and 234 when the switch 238 is closed.

The portable main device 100 is preferably configured so as, with the aid of an integrated controller (not shown in FIG. 4), to control the test procedure with the aid of the test signal generated by the high-voltage transformer 300.

Figure 5:
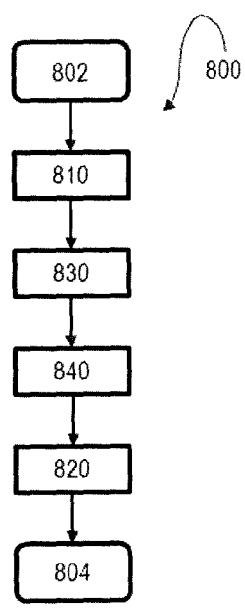
FIG. 5 shows a flowchart of a method for producing a high-voltage transformer according to one embodiment.

FIG. 5 shows a flowchart of a method 800 for producing a high-voltage transformer according to one embodiment of the present invention.

In one exemplary embodiment, the method 800 includes the method steps 810, 820, 830 and 840. The method 800 begins at the start 802 of the method and ends at the end 804 of the method, wherein the method steps are carried out in the following order, and some variants of the method—for example for producing specific embodiments, developments, variants or exemplary embodiments according to the description and/or according to the figures—may have further method steps.

In method step 810, a magnetizable core is provided for the high-voltage transformer configured as a toroidal transformer.

In method step 830, a coil wire is wound, at least partially as a pilgrim step winding, around the magnetizable core, such that a high-voltage winding of the high-voltage transformer is formed.

In method step 840, a protective layer is applied, said protective layer enveloping the high-voltage winding on a side facing away from the magnetizable core and electrically insulating the high-voltage winding in the direction of the side that faces away.

In method step 820, a coil wire is wound around the high-voltage winding enveloped by the protective layer, such that a low-voltage winding of the high-voltage transformer with a number of turns smaller than a number of turns of the high-voltage winding is formed, and the protective layer electrically insulates the high-voltage winding and the low-voltage winding from one another.

The invention claimed is:

1. A high-voltage transformer,
wherein the high-voltage transformer is designed as a toroidal transformer and comprises:
a magnetizable core;
a low-voltage winding, which is arranged around the magnetizable core;
a high-voltage winding, which is arranged around the magnetizable core and is electrically insulated from the low-voltage winding,
the high-voltage winding being embodied at least partially as a pilgrim step winding; and
a protective layer, arranged between the high-voltage winding and the low-voltage winding,
the protective layer being configured such that it electrically insulates the high-voltage winding and the low-voltage winding from one other,
the protective layer comprising an electrically conductive layer for shielding the high-voltage winding from the low-voltage winding,
the high-voltage winding being arranged concentrically around the magnetizable core, the protective layer being arranged concentrically around the high-voltage winding, and the low-voltage winding being arranged concentrically around the protective layer, and
the protective layer comprising a first electrically insulating layer adjacent to the high-voltage winding, a second electrically insulating layer adjacent to the low-voltage winding, and the electrically conductive layer disposed between the first electrically insulating layer and the second electrically insulating layer.

2. The high-voltage transformer as claimed in claim 1, wherein the high-voltage winding is arranged directly around the magnetizable core.

3. The high-voltage transformer as claimed in claim 1, wherein the low-voltage winding is arranged around the high-voltage winding.

4. The high-voltage transformer as claimed in claim 1, wherein the high-voltage winding extends around the magnetizable core with at most one circuit along a forward direction, and wherein the forward direction is locally along a respective direction of the magnetizable core.

5. The high-voltage transformer as claimed in claim 1, wherein the magnetizable core comprises an insulation layer for electrically insulating the latter from the low-voltage winding and high-voltage winding.

6. The high-voltage transformer as claimed in claim 1, wherein the magnetizable core comprises no electrical ground connection or earthing connection.

7. The high-voltage transformer as claimed in claim 1, wherein the high-voltage transformer is configured to generate a high-voltage test signal for a test system for testing a high-voltage device.

8. A test signal apparatus for a test system for testing a high-voltage device, comprising:
   a high-voltage transformer as claimed in claim 1;
   wherein the test signal apparatus is set up to generate, by means of the high-voltage transformer, a test signal, to be applied between a first connection point and a second connection point of the high-voltage winding of the high-voltage transformer, and to provide the test signal for testing the high-voltage device.

9. A test system for testing a high-voltage device, comprising:
   a portable main device with a housing; and
   a portable auxiliary device with a separate housing, which auxiliary device can be electrically connected to the main device;
   wherein the portable auxiliary device is designed as a portable high-voltage test signal apparatus and comprises a test signal apparatus as claimed in claim 8; and
   wherein the portable main device is set up to control the generation of the test signal by the high-voltage transformer of the portable auxiliary device for testing the high-voltage device.

10. The high-voltage transformer as claimed in claim 1, wherein the magnetizable core is annular.

11. A high-voltage transformer,
    wherein the high-voltage transformer is designed as a toroidal transformer and comprises:
    a magnetizable core;
    a low-voltage winding, which is arranged around the magnetizable core; and
    a high-voltage winding, which is arranged around the magnetizable core and is electrically insulated from the low-voltage winding,
    wherein the high-voltage winding is embodied at least partially as a pilgrim step winding; and
    wherein the high-voltage winding comprises a plurality of turns grouped into (i) a plurality of first groups of turns, wherein the turns in each first group are wound electrically in series and helically toward a forward direction around the magnetizable core, and (ii) a plurality of second groups of turns, wherein the turns in each second group are wound electrically in series and helically counter to the forward direction around the magnetizable core,
    the first and second groups of turns being alternately connected electrically in series with one another and alternately wound around the magnetizable core,
    a first number of turns in the forward direction for one of the first groups being followed by a second number of turns counter to the forward direction for one of the second groups,
    the first number being greater than the second number so that a winding in the forward direction is obtained overall.

* * * * *